(12) United States Patent
Xiu

(10) Patent No.: US 10,324,489 B2
(45) Date of Patent: Jun. 18, 2019

(54) SIGNAL GENERATOR AND SIGNAL GENERATION METHOD

(71) Applicant: BOE TECHNOLOGY GROUP CO., LTD., Beijing (CN)

(72) Inventor: Liming Xiu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/690,625

(22) Filed: Aug. 30, 2017

(65) Prior Publication Data

US 2018/0196460 A1 Jul. 12, 2018

(30) Foreign Application Priority Data

Jan. 9, 2017 (CN) .......................... 2017 1 0013863

(51) Int. Cl.
| | | |
|---|---|---|
| *G06F 1/03* | (2006.01) | |
| *H03K 3/037* | (2006.01) | |
| *H03L 7/08* | (2006.01) | |
| *G06F 1/08* | (2006.01) | |
| *H03K 7/06* | (2006.01) | |

(52) U.S. Cl.
CPC .............. *G06F 1/0342* (2013.01); *G06F 1/08* (2013.01); *H03K 3/037* (2013.01); *H03K 7/06* (2013.01); *H03L 7/08* (2013.01)

(58) Field of Classification Search
CPC ......... G06F 1/0342; G06F 1/08; H03K 3/037; H03K 7/06; H03L 7/08
See application file for complete search history.

(56) References Cited

U.S. PATENT DOCUMENTS

| | | | |
|---|---|---|---|
| 7,791,415 B2 * | 9/2010 | Hornbuckle | .......... H03L 7/1976 331/1 A |
| 2008/0284531 A1 | 11/2008 | Hornbuckle | |
| 2014/0111184 A1 | 4/2014 | Dalebroux | |
| 2014/0184291 A1 | 7/2014 | Yang et al. | |

FOREIGN PATENT DOCUMENTS

| | | |
|---|---|---|
| CN | 103777048 A | 5/2014 |
| CN | 103916121 A | 7/2014 |

OTHER PUBLICATIONS

Xiu, Liming, "Nanometer Frequency Synthesis Beyond the Phaselocked Loop", IEEE Press, A John Wiley & Sons, Inc., Publication, 2012, 334 pages.
Xiu, Liming, "From Frequency to Time-Average-Frequency: A Paradigm Shift in the Design of Electronic Systems", IEEE Press Series on Microelectronic Systems, A John Wiley & Sons, Inc., Publication, 2015, 179 pages.
Chinese Office Action in Chinese Application No. 201710013863.6, dated Jan. 23, 2019 with English translation.

* cited by examiner

*Primary Examiner* — Daniel C Puentes
(74) *Attorney, Agent, or Firm* — Collard & Roe, P.C.

(57) ABSTRACT

The present application provides a signal generator, comprising a control circuit configured to receive input information, and generate variable control word information based on the received input information; a base time unit generation circuit configured to generate a base time unit; and a signal generation circuit configured to receive the variable control word information from the control circuit and receive the base time unit from the base time unit generation circuit, and generate a target signal having a variable frequency based on the received variable control word information and the received base time unit.

11 Claims, 5 Drawing Sheets

SIGNAL GENERATOR AND SIGNAL GENERATION METHOD

CROSS REFERENCE TO RELATED APPLICATIONS

Applicant claims priority under 35 U.S.C. § 119 of Chinese Application No. CN 201710013863.6 filed on Jan. 9, 2017, the disclosure of which is incorporated by reference.

TECHNICAL FIELD

The present disclosure relates to a signal generator and a signal generation method.

BACKGROUND

Chirp signal is a signal whose frequency changes over time. Such signal has been widely used in sonar, radar, spread spectrum communications, resonant converter, electronic ballast, and the like. However, at present, chirp signal is usually generated by using a phase-locked loop or an analog frequency synthesis method. When chirp signal is generated by using the phase-locked loop, an output frequency modulation mode cannot be precisely controlled, which results in deterioration of performance of the chirp signal. When chirp signal is generated by using the analog frequency synthesis method, it is required to use mixer and filter, which results in very high cost and impossibility to be implemented on a chip.

To cope with this, it is desirable to provide a signal generator and a signal generation method capable of generating a chirp signal with high accuracy and at a low cost.

SUMMARY

According to an embodiment of the present application, there is provided a signal generator, comprising:

a control circuit configured to receive input information, and generate variable control word information based on the received input information;

a base time unit generation circuit configured to generate a base time unit; and a signal generation circuit configured to receive the variable control word information from the control circuit and receive the base time unit from the base time unit generation circuit, and generate a target signal having a variable frequency based on the received variable control word information and the received base time unit.

Optionally, the control circuit comprises:

an input subcircuit configured to receive the input information, the input information including type information indicating a waveform type of frequency change of the target signal and parameter information of the target signal;

a calculation subcircuit configured to extract the type information and the parameter information from the input information received from the input subcircuit, and calculate the variable control word information based on the type information and the parameter information; and an output subcircuit configured to output the control word information calculated by the calculation subcircuit to the signal generation circuit.

Optionally, the waveform type of frequency change of the target signal includes at least a triangular wave, a sine wave, an exponential wave; and the parameter information of the target signal includes a carrier frequency ($f_c$), a modulation rate ($f_m$), a maximum frequency deviation ($\Delta f$), and an interval length of the target signal.

Optionally, the base time unit generation circuit comprises:

a voltage-controlled oscillator that oscillates at a predetermined oscillation frequency;

a phase-locked loop circuit that locks an output frequency of the voltage-controlled oscillator to a first output frequency;

K output terminals that output K phase-evenly-spaced output signals, K being a positive integer greater than one, wherein the base time unit is a time span between any two adjacent output signals outputted by the K output terminals.

Optionally, the signal generation circuit comprises:

a first input subcircuit configured to receive the K phase-evenly-spaced output signals from the base time subcircuit generation circuit;

a second input subcircuit configured to receive the variable control word information from the control circuit; and an output subcircuit configured to output the generated target signal having a variable frequency.

Optionally, the first input subcircuit comprises:

a K→1 multiplexer having a plurality of input terminals for receiving the K phase-evenly-spaced output signals, a control input terminal, and an output terminal, the output subcircuit comprises:

a toggle flip-flop for generating a pulse train, the toggle flip-flop comprising:

a D-type flip-flop having a clock input terminal for receiving an output from an output terminal of the K→1 multiplexer, a data input terminal, and an output terminal for outputting a first clock signal; and an inverter having an input terminal for receiving the first clock signal and an output terminal for outputting a second clock signal, the second clock signal being connected to the data input terminal of the D-type flip-flop, the first clock signal containing the pulse train;

an output terminal for outputting the first clock signal as the target signal having a variable frequency;

the second input subcircuit comprises:

a control logic circuit having a control word information input terminal for receiving the control word information, a clock input terminal for receiving the first clock signal, and an output terminal connected to the control input terminal of the K→1 multiplexer.

Optionally, the first input subcircuit comprises:

a first K→1 multiplexer having a plurality of input terminals for receiving the K phase-evenly-spaced output signals, a control input terminal, and an output terminal;

a second K→1 multiplexer having a plurality of input terminals for receiving the K phase-evenly-spaced output signals, a control input terminal, and an output terminal; and a 2→1 multiplexer having a first input terminal for receiving an output of the first K→1 multiplexer, a second input terminal for receiving an output of the second K→1 multiplexer, a control input terminal, and an output terminal, the output subcircuit comprises:

a toggle flip-flop for generating a pulse train, the toggle flip-flop comprising:

a D-type flip-flop having a clock input terminal for receiving an output from an output terminal of the K→1 multiplexer, a data input terminal, and an output terminal for outputting a first clock signal; and an inverter having an input terminal for receiving the first clock signal and an output terminal for outputting a second clock signal, the second clock signal being connected to the data input terminal of the D-type flip-flop, the first clock signal containing the pulse train;

an output terminal for outputting the first clock signal as the target signal having a variable frequency;

the second input subcircuit comprises:

a control logic circuit having a control word information input terminal for receiving the control word information, a first clock input terminal for receiving the first clock signal, a second clock input terminal for receiving the second clock signal, a first output terminal connected to the control input terminal of the first K→1 multiplexer, and a second output terminal connected to the control input terminal of the second K→1 multiplexer, wherein the first clock signal is connected to the control input terminal of the 2→1 multiplexer.

Optionally, the control word information is set in form of F=I+r, I being an integer in range of [2, 2K], r being a decimal in range of [0, 1).

Optionally, the output frequency of the signal generation circuit is approximately proportional to the control word information when a predetermined condition is satisfied, and the predetermined condition is that a change amount of the control word information is less than a predetermined threshold.

Optionally, the control circuit generates, based on frequency change characteristics of the target signal, the control word information having the same change characteristics.

According to another embodiment of the present application, there is provided A signal generation method for use in a signal generator, the method comprising:

receiving input information and generating variable control word information based on the received input information;

generating a base time unit; and generating a target signal having a variable frequency based on the variable control word information and the base time unit.

Optionally, the input information includes type information indicating a waveform type of frequency change of the target signal and parameter information of the target signal;

the method further comprises:

extracting the type information and the parameter information from the input information, and calculating the variable control word information based on the type information and the parameter information; and outputting the calculated control word information to a signal generation circuit of the signal generator.

Optionally, the control word information is set in form of F=I+r, I being an integer in range of [2, 2K], r being a decimal in range of [0, 1).

Optionally, the output frequency of the signal generation circuit is approximately proportional to the control word information when a predetermined condition is satisfied, and the predetermined condition is that a change amount of the control word information is less than a predetermined threshold.

Optionally, the signal generation method further comprises:

generating, based on frequency change characteristics of the target signal, the control word information having the same change characteristics.

DETAILED DESCRIPTION OF THE EMBODIMENTS

Hereinafter, the signal generator and the signal generation method according to the embodiments of the present application shall be described in detail with reference to the drawings.

Figure 1:
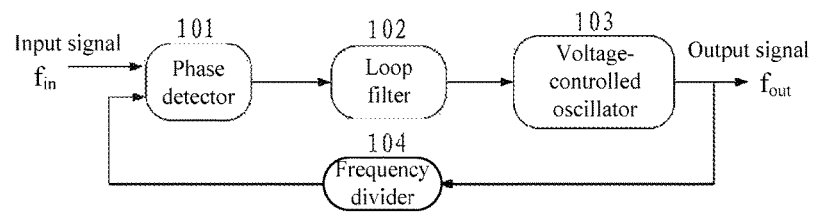
FIG. 1 is a circuit diagram illustrating a signal generator in the related art.

At present, the frequency synthesis technique is usually based on phase-locked loop technique. FIG. 1 illustrates the frequency synthesis technique based on the phase-locked loop (PLL) in the related art.

As shown in FIG. 1, an input frequency fin is first inputted into a phase detector 101, then into a loop filter 102, thereafter into a voltage-controlled oscillator 103, finally an output frequency fout is obtained. The output frequency fout is fed back to the phase detector 101 through a frequency divider 104 at the same time. In this way, by adjusting a frequency-division coefficient, the desired output frequency fout can be obtained.

However, due to the feedback loop used in this mechanism, such non-direct generation of the output frequency fout cannot be precisely controlled. In addition, when changing the frequency-division factor, it takes a relatively long time to lock by the phase-locked loop and obtain the desired output frequency fout.

Therefore, in order to quickly and accurately switch between arbitrary frequency values, the signal generator of the present application is proposed. The signal generator according to an embodiment of the present application is a pure digital circuit set based on the concept of Time-Average-Frequency Direct Period Synthesis (TAF-DPS).

As is well known to those skilled in the art, in an electronic circuit, the clock signal is the most important control signal, it serves as a trigger to trigger a logic operation and serves as a switch to control a sampling system. Thus, the frequency usually refers to the number of clock pulses that occur within a time period of one second. In the related art, all cycles of the clock pulses have the same time length.

However, such restriction of "all cycles have the same time length" is unfavorable in many cases. For example, such restriction is unfavorable when generating a chirp signal whose frequency increases or decreases over time.

Based on this consideration, the inventor of the present application has proposed the concept of average time frequency. The concept of average time frequency is based on the understanding that frequency is a long term concept and has the restriction of "all cycles have the same time length" to be removed.

Figure 2:
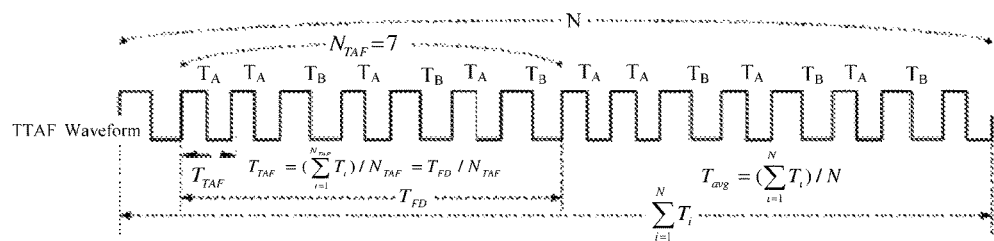
FIG. 2 is an explanatory diagram illustrating the concept of an average time frequency.

The concept of the average time frequency is briefly described below in combination with FIG. 2. FIG. 2 shows a clock signal train formed by interleaving two clock signals, a clock signal $T_A$ having a first period and a clock signal $T_B$ having a second period. In the example shown in FIG. 2, the clock signal $T_A$ and the clock signal $T_B$ are interleaved according to a pattern of $T_A$, $T_A$, $T_B$, $T_A$, $T_B$, $T_A$, $T_B$, and a repetition length of such pattern is seven signal periods. It should be noted that, for illustrative purposes, only seven signal periods are shown in FIG. 2, and an arbitrary number of signal periods can be set as desired in practical applications.

Thus, the signal period $T_{avg}$ may be expressed as follows:

$$1/f_{avg}=T_{avg}=(\Sigma_{i=1}^{N}T_i)/N, \text{ where } T_i=T_A \text{ or } T_B \quad \text{Formula (1)}$$

If $N_{TAF}$ is a minimum period number that causes a clock waveform repetition, the signal period $T_{TAF}$ may be calculated as follows:

$$1/f_{TAF}=T_{TAF}=(\Sigma_{i=1}^{N_{TAF}}T_i)/N_{TAF}, \text{ where } T_i=T_A \text{ or } T_B \quad \text{Equation (2)}$$

A signal reference period $T_{FD}$ is defined as follows:

$$1/F_{FD}=T_{FD}=\Sigma_{i=1}^{N_{TAF}}T_i, \text{ where } T_i=T_A \text{ or } T_B \quad \text{Formula (3)}$$

First Embodiment

Figure 3:
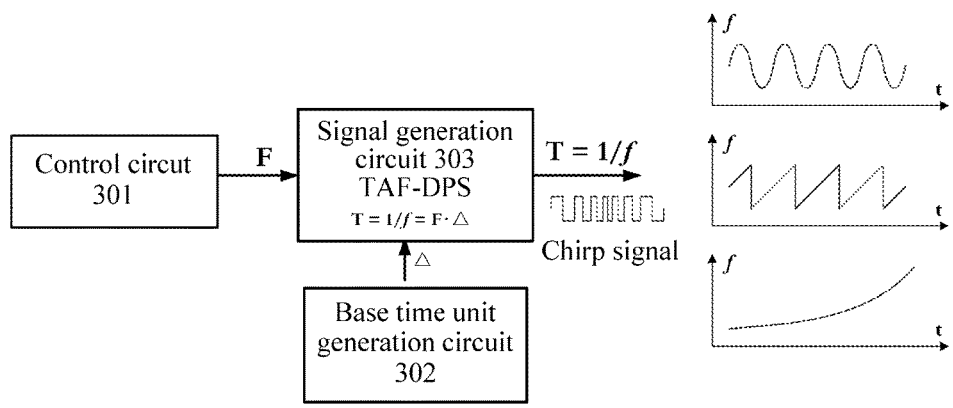
FIG. 3 is a block diagram illustrating a signal generator according to a first embodiment of the present application.

Hereinafter, the signal generator according to a first embodiment of the present application will be described with reference to FIG. 3. As shown in FIG. 3, the signal generator 300 according to the first embodiment of the present application comprises:

a control circuit 301 configured to receive input information, and generate variable control word information based on the received input information;

a base time unit generation circuit 302 configured to generate a base time unit; and a signal generation circuit 303 configured to receive the variable control word information from the control circuit 301 and receive the base time unit from the base time unit generation circuit 302, and generate a target signal having a variable frequency based on the received variable control word information and the received base time unit.

Figure 4:
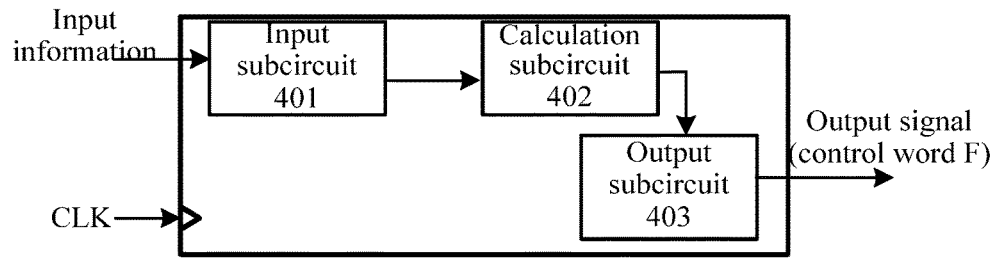
FIG. 4 is a diagram illustrating basic structure of a control circuit according to the first embodiment of the present application.

FIG. 4 shows basic structure of the control circuit 301.

As shown in FIG. 4, the control circuit 301 comprises:

an input subcircuit 401 configured to receive the input information, the input information including type information indicating a waveform type of frequency change of the target signal and parameter information of the target signal;

a calculation subcircuit 402 configured to extract the type information and the parameter information from the input information received from the input subcircuit, and calculate the variable control word information based on the type information and the parameter information; and an output subcircuit 403 configured to output the control word information calculated by the calculation subcircuit to the signal generation circuit.

Among the input information received by the input subcircuit 401, for example, the waveform type of frequency change of the target signal includes at least a triangular wave, a sine wave, an exponential wave. It needs to be noted that, the aforesaid waveform examples merely are examples, the signal generator according to an embodiment of the present application may generate a chirp signal of an arbitrary frequency change waveform.

In addition, the parameter information of the target signal includes a carrier frequency ($f_c$), a modulation rate ($f_m$), a maximum frequency deviation ($\Delta f$), and an interval length of the target signal.

The calculation subcircuit 402 extracts the type information and the parameter information from the input information received from the input subcircuit 401, and calculates the variable control word information based on the type information and the parameter information.

Specifically, for example, when the type information indicates the frequency change of the chirp signal is a linearly changed waveform (e.g. triangular wave), correspondingly, the input information further includes for example parameter information of a carrier frequency ($f_c$), a modulation rate ($f_m$), a maximum frequency deviation ($\Delta f$), and an interval length of the triangular wave.

The calculation subcircuit 402 extracts the parameter information, and calculates the control word information. The detailed process of calculating the control word information will be described in detail later.

The output subcircuit 403 may, for example, under control of a clock signal, output the control word information calculated by the calculation subcircuit 402 to the signal generation circuit 303.

The signal generation circuit 303 for example is based on the above described TAF-DPS technique, that is to say, the signal generation circuit may also be referred to as a TAF-DPS frequency synthesizer. In the following description, TAF-DPS 510 is used to represent the signal generation circuit 303. Working principle of the TAF-DPS 510 will be described with reference to FIG. 5.

The TAF-DPS 510 has two inputs: a base time unit $\Delta$520 and a frequency/period control word (F)530, where F=I+r, I being an integer larger than one, r being a decimal. The TAF-DPS 510 has one output CLK 550. The CLK 550 is a synthesized time average frequency clock signal. Starting from the base time unit 520, TAF-DPS 510 generates two types of periods $T_A=I*\Delta$ and $T_B=(I+1)*\Delta$. The output CLK is a clock pulse train 540 that contains two types of periods, both $T_A$ 541 and $T_B$ 542. Thus they are used in an interleaved fashion. The fraction r identifies an occurrence probability of the period type $T_B$, thus r also determines an occurrence probability of $T_A$.

Figure 5:
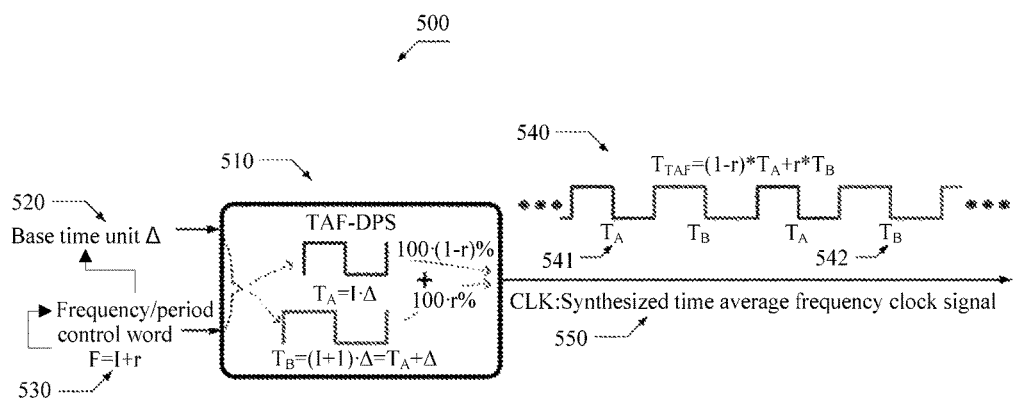
FIG. 5 is a diagram illustrating basic structure of a signal generation circuit according to the first embodiment of the present application.

Specifically, as shown in FIG. 5, a period $T_{TAF}$ of the outputted CLK may be represented by the following formula:

$$T_{TAF} = (1-r)*T_A + r*T_B =$$ Formula (4)

$$T_A + r*(T_B - T_A) = T_A + r*\Delta = I*\Delta + r*\Delta = (I+r)*\Delta$$

Therefore, when the control word F=I+r, it can be derived:

$$T_{TAF} = F*\Delta$$ Formula (5)

According to the above Formula (5), it can be known that, the period $T_{TAF}$ of the output clock signal CLK of the TAF-DPS 510 is linearly proportional to the control word F. When the generated control word F changes with a predetermined waveform, the period $T_{TAF}$ of the output clock signal CLK of the TAF-DPS 510 also changes with the same waveform.

In addition, since the period T is inversely proportional to the frequency f, the frequency of the output clock signal may also change along with the waveform of the control word approximately in a linear manner, when a predetermined condition is satisfied, for example, a change amount of the control word F is very small (less than a predetermined threshold).

Therefore, the control circuit 301 generates, based on frequency change characteristics of the target signal, the control word information having the same change characteristics. Accordingly, the target signal having the desired frequency change characteristic is generated by the TAF-DPS 510.

Hereinafter, structure of the base time unit generation circuit 302 will be described with reference to FIG. 6.

Figure 6:
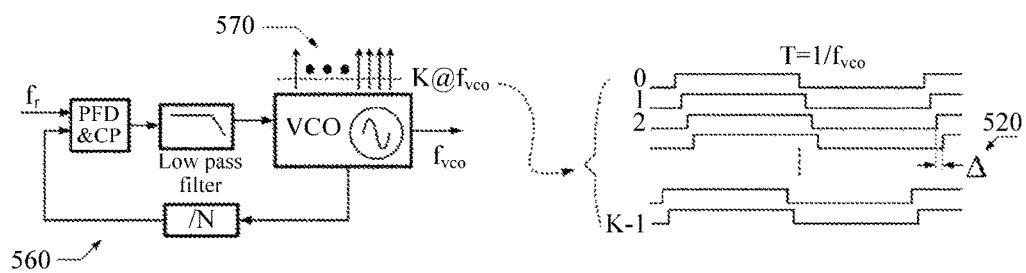
FIG. 6 is a diagram illustrating basic structure of a base time unit generation circuit according to the first embodiment of the present application.

As shown in FIG. 6, the base time unit generation circuit 302 comprises:

a voltage-controlled oscillator 507 that oscillates at a predetermined oscillation frequency;

a phase-locked loop circuit 560 that locks an output frequency of the voltage-controlled oscillator to a first output frequency ($f_{vco}$);

K output terminals that output K phase-evenly-spaced output signals, K being a positive integer greater than one.

Specifically, the base time unit Δ520 usually is generated from a multi-stage VCO (voltage-controlled oscillator) 570. A is a time span between any two adjacent VCO outputs. VCO may be locked to a reference frequency of known frequency through a phase-locked loop (PLL) 560. As a result, VCO frequency $f_{vco}$ is a known value. As shown in FIG. 6, VCO 570 has K outputs whose phases are evenly spaced, where K is a positive integer larger than one. Consequently, the base time unit Δ may be calculated by using the following formula:

$$\Delta = T_{VCO}/K = 1/(K \cdot f_{VCO})$$ Formula (6)

Hereinafter, two examples of the circuit structure of AF-DPS 510 according to an embodiment of the present application will be described with reference to FIGS. 7 and 8.

The TAF-DPS 510 according to an embodiment of the present application comprises:

a first input subcircuit configured to receive the K phase-evenly-spaced output signals from the base time subcircuit generation circuit;

a second input subcircuit configured to receive the variable control word information from the control circuit; and an output subcircuit configured to output the generated target signal having a variable frequency.

Figure 7:
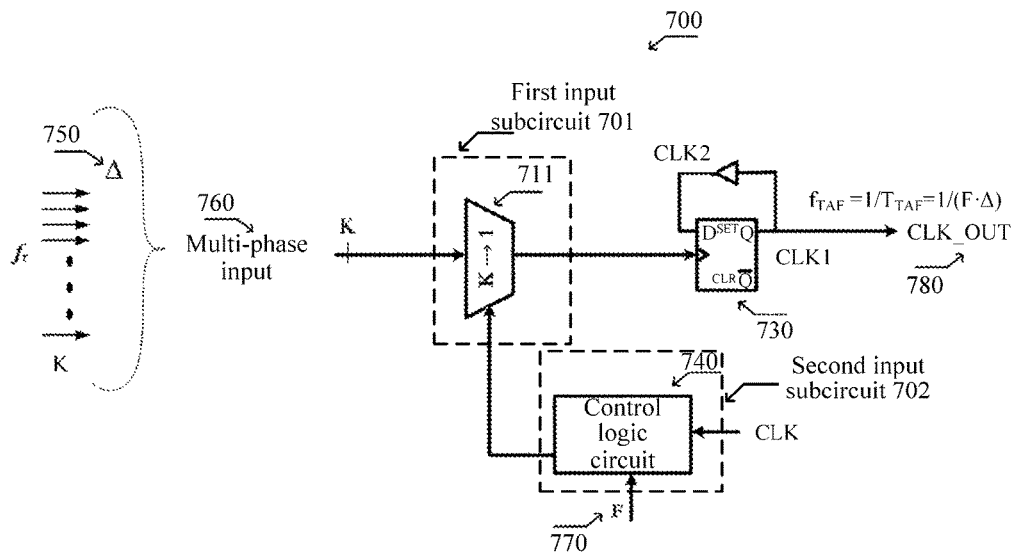
FIG. 7 is a diagram illustrating a first example of circuit configuration of a signal generation circuit according to the first embodiment of the present embodiment.
Figure 8:
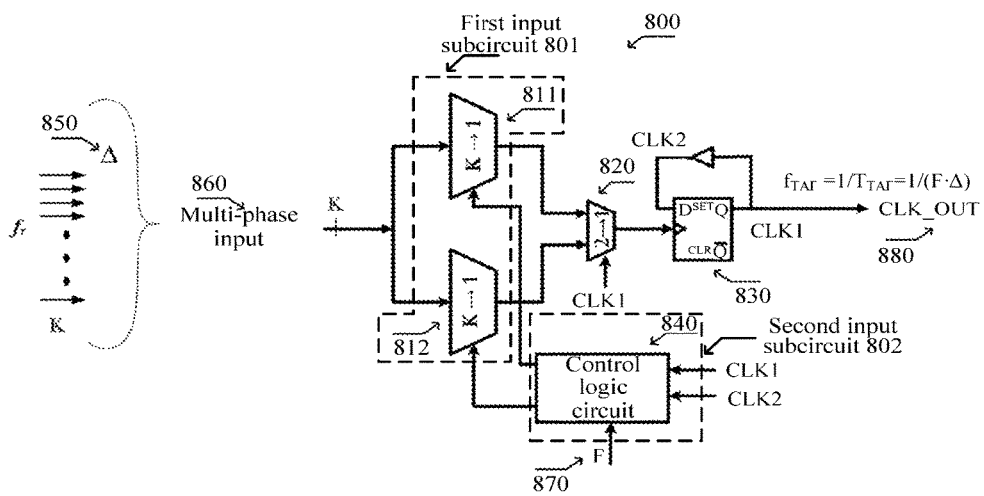
FIG. 8 is a diagram illustrating a second example of circuit configuration of a signal generation circuit according to the first embodiment of the present embodiment.

As shown in FIG. 7, in an embodiment, the first input subcircuit comprises:

a K→1 multiplexer 711 having a plurality of input terminals for receiving the K phase-evenly-spaced output signals 760, a control input terminal, and an output terminal. The multi-phase input 760 has K phase-evenly-spaced signals, each of which has a frequency of fr. A time span between any two logically adjacent phases is Δ750. The Δ750 is calculated as Δ=$T_r$/K=1/(K·$f_r$).

The output subcircuit comprises a toggle flip-flop for generating a pulse train.

The toggle flip-flop comprises:

a D-type flip-flop 730 having a clock input terminal for receiving an output from an output terminal of the K→1 multiplexer, a data input terminal, and an output terminal for outputting a first clock signal CLK1;

an inverter having an input terminal for receiving the first clock signal CLK1 and an output terminal for outputting a second clock signal CLK2, the second clock signal being connected to the data input terminal of the D-type flip-flop, the first clock signal containing the pulse train;

an output terminal for outputting the first clock signal as the target signal CLKOUT 780 having a variable frequency;

The period of the TAF-DPS output signal CLKOUT 780 may be calculated as $T_{TAF}$=F*Δ. For example, the control word F is set in form of F=I+r, where I is an integer in range of [2, 2K], r is a decimal in range of [0,1).

The second input subcircuit comprises:

a control logic circuit 740 having a control word information input terminal for receiving the control word information F770 generated by the control circuit 301, a clock input terminal for receiving the first clock signal, and an output terminal connected to the control input terminal of the K→1 multiplexer.

In another embodiment, the first input subcircuit comprises:

a first K→1 multiplexer 811 having a plurality of input terminals for receiving the K phase-evenly-spaced output signals, a control input terminal, and an output terminal;

a second K→1 multiplexer 812 having a plurality of input terminals for receiving the K phase-evenly-spaced output signals, a control input terminal, and an output terminal; and a 2→1 multiplexer 820 having a first input terminal for receiving an output of the first K→1 multiplexer, a second input terminal for receiving an output of the second K→1 multiplexer, a control input terminal, and an output terminal, The output subcircuit comprises a toggle flip-flop for generating a pulse train.

The toggle flip-flop comprises:

a D-type flip-flop 830 having a clock input terminal for receiving an output from an output terminal of the K→1 multiplexer, a data input terminal, and an output terminal for outputting a first clock signal;

an inverter having an input terminal for receiving the first clock signal CLK1 and an output terminal for outputting a second clock signal CLK2, the second clock signal being connected to the data input terminal of the D-type flip-flop, the first clock signal containing the pulse train;

an output terminal for outputting the first clock signal as the target signal CLKOUT 880 having a variable frequency.

The second input subcircuit comprises:

a control logic circuit 840 having a control word information input terminal for receiving the control word information 870, a first clock input terminal for receiving the first clock signal CLK1, a second clock input terminal for receiving the second clock signal CLK2, a first output terminal connected to the control input terminal of the first K→1 multiplexer, and a second output terminal connected to the control input terminal of the second K→1 multiplexer, wherein the first clock signal is connected to the control input terminal of the 2→1 multiplexer.

Optionally, the control word information is set in form of F=I+r, I being an integer in range of [2, 2K], r being a decimal in range of [0, 1).

Regarding the working principle of TAF-DPS, reference may be made to the document L. XIU, "Nanometer Frequency Synthesis beyond Phase-locked Loop", August 2012, John Wiley IEEE press, which is incorporated by reference herein in its entirety.

Hereinafter, the process of generating a signal by the signal generator will be described in detail with reference to FIGS. 9-12.

Figure 9:
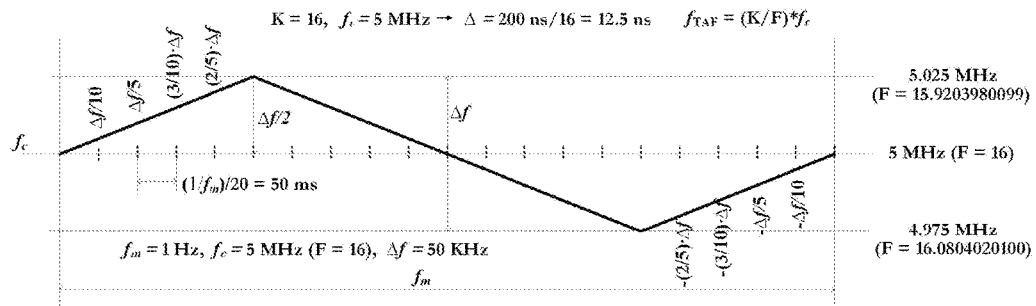
FIG. 9 is a waveform diagram illustrating control word information generated by the signal generator according to the first embodiment of the present application.

Specifically, FIG. 9 shows a waveform of the frequency control word F generated by the signal generator 300 according to the first embodiment.

The following formula may be derived from the above Formulas (5) and (6):

$$f_{TAF}=(K/F)*fvco \qquad \text{Formula (7)}$$

$$F=K*(fvco/f_{TAF}) \qquad \text{Formula (8)}$$

As shown in FIG. 9, in this example, it is assumed that the K phase-evenly-spaced output signals generated by the base signal unit generation circuit is 16, that is, K=16.

In addition, it is assumed that, in the input information received from the control circuit, the carrier frequency $f_c$ (i.e., fvco) is 5 MHz, the modulation rate is $f_m$=1 Hz, the maximum frequency deviation is Δf=50 KHz, and an interval length is (1/fm)/20=50 ms.

In this case, as shown in FIG. 9, the frequency $f_{TAF}$ of the output signal CLKOUT maximally is 15.025 MHz, and minimally is 14.975 MHz.

According to Formula (8), at the maximum $f_{TAF}$ (i.e., 15.025 MHz), the control word is F=15.9203980099, at the minimum $f_{TAF}$ (i.e., 14.975 MHz), the control word is 16.0804020300.

Meanwhile, the frequency of the output signal CLKOUT at position dots of the respective spaced lengths may be calculated according to the triangle wave function.

By means of calculating the frequency $f_{TAF}$ at each spaced length, a size of the corresponding control word F may be calculated. As shown in FIG. 9, the value of F at each dot of Δf/10, Δf/5, Δf*(3/10), Δf*(2/5) . . . −Δf/10 may be calculated as shown in FIG. 9.

In addition, when the carrier frequency $f_c$ is 5 MHz, the period of the clock signal is 200 ns. Therefore, when K=16, Δ=T/K=200 ns/16=12.5 ns.

The control word F and the base time unit Δ which are calculated in this way are input to the signal generation circuit. Thereafter, the signal generation circuit correspondingly generates the output signal CLKOUT based on the control word F and the base time unit Δ.

For example, in addition, as shown in Formula (7), $f_{TAF}$=(K/F)*fvco. When F=16, the frequency of the generated CLKOUT is $f_{TAF}$=(16/16)*5 MHz=5 MHz.

Figure 10:
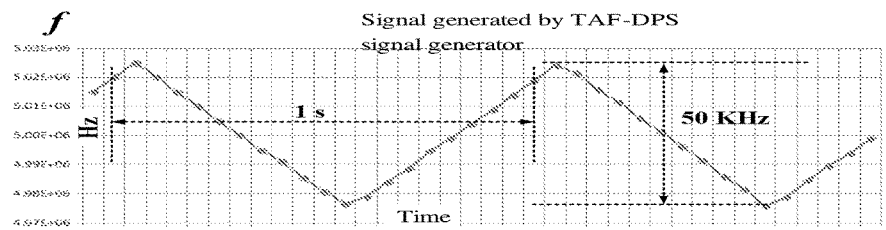
FIG. 10 is a waveform diagram illustrating a first example of a target signal generated by a signal generator according to the first embodiment of the present application.

The generated CLKOUT signal is as shown in FIG. 10. As can be seen from FIG. 10, when the control word changes with a triangle wave, the generated CLKOUT signal is a chirp signal whose frequency changes over time.

Figure 11:
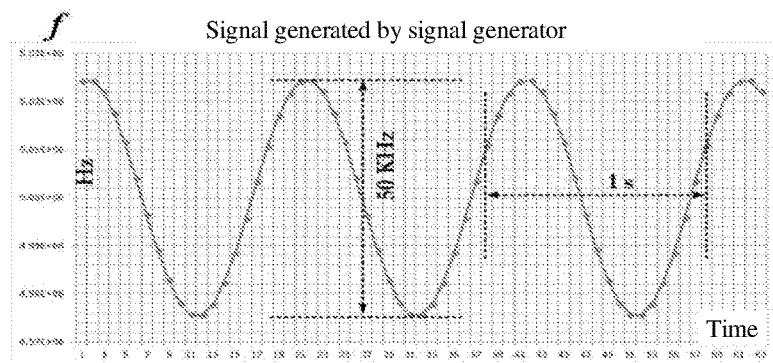
FIG. 11 is a waveform diagram illustrating a second example of a target signal generated by a signal generator according to the first embodiment of the present application.

Based on the same manner as above, when the control circuit calculates the respective values of the control word with a sine function, the generated CLKOUT signal is a chirp signal whose frequency changes over time and with a since waveform, as shown in FIG. 11.

Figure 12:
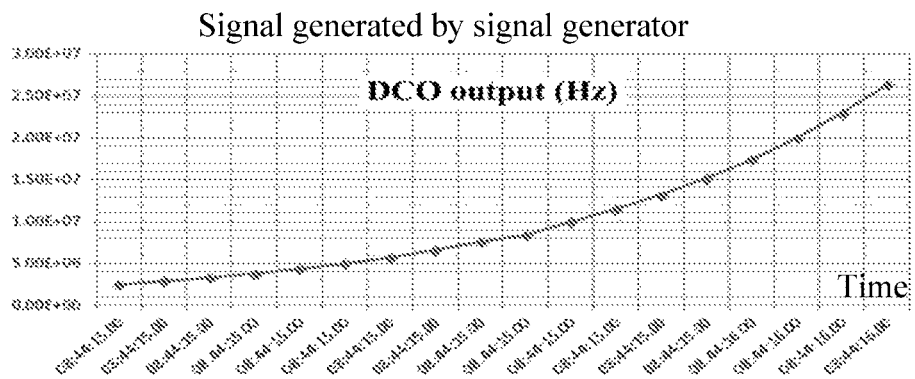
FIG. 12 is a waveform diagram illustrating a third example of a target signal generated by a signal generator according to the first embodiment of the present application.

Based on the same manner as above, when the control circuit calculates the respective values of the control word with an exponential function, the generated CLKOUT signal is a chirp signal whose frequency changes over time and with an exponential waveform, as shown in FIG. 12.

Therefore, unlike the way of controlling the frequency of the output signal by a feedback loop in the related art, the signal generator according to the present application directly synthesizes the target signal through the control word. Accordingly, it is assumed that there are sufficient resources (the bit number of the fractional part r is sufficient), it is almost possible to generate any frequency. In addition, since each individual pulse is directly constructed, the output frequency can be changed instantaneously, thereby fast frequency switching can be achieved.

Therefore, the signal generator according to the first embodiment of the present application can generate a chirp signal with low cost and high accuracy.

Second Embodiment

Figure 13:
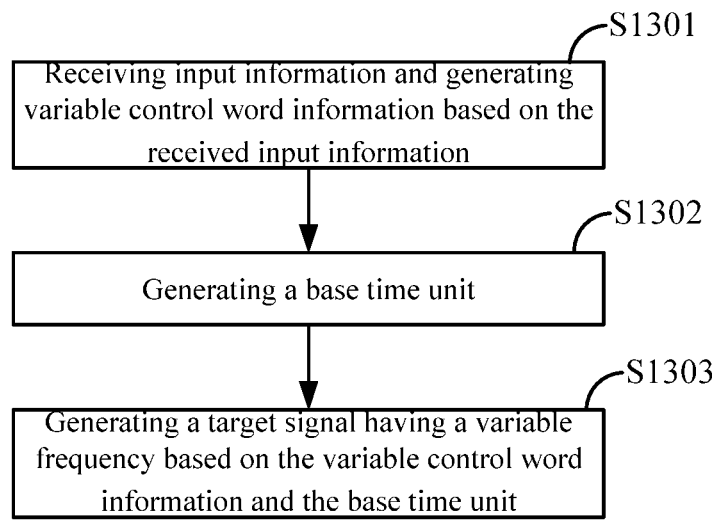
FIG. 13 is a flowchart illustrating a signal generation method according to a second embodiment of the present application.

Hereinafter, a signal generation method according to a second embodiment of the present application will be described with reference to FIG. 13. The signal generation method is applied to the signal generator in the first embodiment described above.

Step S1301: receiving input information and generating variable control word information based on the received input information;

Step S1302: generating a base time unit; and

Step S1303: generating a target signal having a variable frequency based on the variable control word information and the base time unit.

Optionally, the input information includes type information indicating a waveform type of frequency change of the target signal and parameter information of the target signal; the signal generation method further comprises:

extracting the type information and the parameter information from the input information, and calculating the variable control word information based on the type information and the parameter information; and outputting the calculated control word information to a signal generation circuit of the signal generator.

Optionally, the control word information is set in form of F=I+r, I being an integer in range of [2, 2K], r being a decimal in range of [0, 1).

Optionally, the output frequency of the signal generation circuit is approximately proportional to the control word information when a predetermined condition is satisfied, and the predetermined condition is that a change amount of the control word information is less than a predetermined threshold.

Optionally, the signal generation method further comprises:

generating, based on frequency change characteristics of the target signal, the control word information having the same change characteristics.

Therefore, unlike the way of controlling the frequency of the output signal by a feedback loop in the related art, the signal generation method according to the embodiment of the present application directly synthesizes the target signal by selecting different input signals through the control word. Accordingly, it is assumed that there are sufficient resources (the bit number of the fractional part r is sufficient), it is almost possible to generate any frequency. In addition, since each individual pulse is directly constructed, the output frequency can be changed instantaneously, thereby fast frequency switching can be achieved.

Therefore, the signal generation method according to the third embodiment of the present application can generate a chirp signal with low cost and high accuracy.

It should be noted that, in the specification, the terms "comprise", "include" and any other variations thereof intend to cover nonexclusive inclusion so that the procedure, the method, the product or the equipment including a series of elements include not only these elements, but also other elements which are not listed explicitly, or also include inherent elements of these procedure, method, product or equipment. In the case that there is no further limitation, elements defined by the expressions "comprise one . . . " do not exclude there being additional identity elements in the procedure, method, product or equipment of the elements.

Finally, it should be noted that, the above-described series of processings do not only comprise processings executed chronologically in the order mentioned here, and also comprise processings executed in parallel or individually but not chronologically.

Through the above description of the implementations, a person skilled in the art can clearly understand that the present application may be implemented in a manner of software plus a necessary hardware platform, and of course the present application may also be implemented fully by hardware. Based on such understanding, the technical solution of the present application that contributes to the background art may be embodied in whole or in part in the form of a software product. The computer software product may be stored in a storage medium, such as ROM/RAM, disk, CD-ROM, and include several instructions for causing a computer apparatus (which may be a personal computer, a server, or a network device) to perform the method described in the various embodiments of the present application or certain parts thereof.

Although the present application has been described in detail in the above, specific examples are applied in this text to demonstrate the principles and implementations of the present application, these descriptions of the above embodiments are only to help understand the method of the present application and its core concept. Meanwhile, for a person with ordinary skill in the art, depending on the concepts of the present application, modifications may be made to the specific implementations and applications. To sum up, contents of this specification should not be construed as limiting the present application.

The present application claims priority of the Chinese Patent Application No. 201710013863.6 filed on Jan. 9, 2017, the entire disclosure of which is hereby incorporated in full text by reference as part of the present application.

What is claimed is:

1. A signal generator, comprising:
   a control circuit configured to receive input information, and generate variable control word information based on the received input information, the input information including type information indicating a waveform type of frequency change of a target signal and parameter information of the target signal;
   a base time unit generation circuit configured to generate a base time unit; and
   a signal generation circuit configured to receive the variable control word information from the control circuit and receive the base time unit from the base time unit generation circuit, and generate the target signal having a variable frequency based on the received variable control word information and the received base time unit,
   wherein the control circuit comprises:
   an input subcircuit configured to receive the input information;
   a calculation subcircuit configured to extract the type information and the parameter information from the input information received from the input subcircuit, and calculate the variable control word information based on the type information and the parameter information; and
   an output subcircuit configured to output the control word information calculated by the calculation subcircuit to the signal generation circuit,
   the output frequency of the signal generation circuit is approximately proportional to the control word information when a predetermined condition is satisfied, and the predetermined condition is that a change amount of the control word information is less than a predetermined threshold.

2. The signal generator according to claim 1, wherein the waveform type of frequency change of the target signal includes at least a triangular wave, a sine wave, an exponential wave; and
   the parameter information of the target signal includes a carrier frequency ($f_c$), a modulation rate ($f_m$), a maximum frequency deviation ($\Delta f$), and an interval length of the target signal.

3. The signal generator according to claim 1, wherein the base time unit generation circuit comprises:
   a voltage-controlled oscillator that oscillates at a predetermined oscillation frequency;
   a phase-locked loop circuit that locks an output frequency of the voltage-controlled oscillator to a first output frequency;
   K output terminals that output K phase-evenly-spaced output signals, K being a positive integer greater than one,
   wherein the base time unit is a time span between any two adjacent output signals outputted by the K output terminals.

4. The signal generator according to claim 3, wherein the signal generation circuit comprises:
   a first input subcircuit configured to receive the K phase-evenly-spaced output signals from the base time unit generation circuit;
   a second input subcircuit configured to receive the variable control word information from the control circuit; and
   an output subcircuit configured to output the generated target signal having a variable frequency.

5. The signal generator according to claim 4, wherein the first input subcircuit comprises:
   a K→1 multiplexer having a plurality of input terminals for receiving the K phase-evenly-spaced output signals, a control input terminal, and an output terminal,
   the output subcircuit comprises:
   a toggle flip-flop for generating a pulse train, the toggle flip-flop comprising:
   a D-type flip-flop having a clock input terminal for receiving an output from an output terminal of the K→1 multiplexer, a data input terminal, and an output terminal for outputting a first clock signal; and
   an inverter having an input terminal for receiving the first clock signal and an output terminal for outputting a second clock signal, the second clock signal being connected to the data input terminal of the D-type flip-flop, the first clock signal containing the pulse train;

an output terminal for outputting the first clock signal as the target signal having a variable frequency;

the second input subcircuit comprises:

a control logic circuit having a control word information input terminal for receiving the control word information, a clock input terminal for receiving the first clock signal, and an output terminal connected to the control input terminal of the K→1 multiplexer.

6. The signal generator according to claim 4, wherein the first input subcircuit comprises:

a first K→1 multiplexer having a plurality of input terminals for receiving the K phase-evenly-spaced output signals, a control input terminal, and an output terminal;

a second K→1 multiplexer having a plurality of input terminals for receiving the K phase-evenly-spaced output signals, a control input terminal, and an output terminal; and a 2→1 multiplexer having a first input terminal for receiving an output of the first K→1 multiplexer, a second input terminal for receiving an output of the second K→1 multiplexer, a control input terminal, and an output terminal, the output subcircuit comprises:

a toggle flip-flop for generating a pulse train, the toggle flip-flop comprising:

a D-type flip-flop having a clock input terminal for receiving an output from an output terminal of the K→1 multiplexer, a data input terminal, and an output terminal for outputting a first clock signal; and an inverter having an input terminal for receiving the first clock signal and an output terminal for outputting a second clock signal, the second clock signal being connected to the data input terminal of the D-type flip-flop, the first clock signal containing the pulse train;

an output terminal for outputting the first clock signal as the target signal having a variable frequency;

the second input subcircuit comprises:

a control logic circuit having a control word information input terminal for receiving the control word information, a first clock input terminal for receiving the first clock signal, a second clock input terminal for receiving the second clock signal, a first output terminal connected to the control input terminal of the first K→1 multiplexer, and a second output terminal connected to the control input terminal of the second K→1 multiplexer, wherein the first clock signal is connected to the control input terminal of the 2→1 multiplexer.

7. The signal generator according to claim 3, wherein the control word information is set in form of F=I+r, I being an integer in range of [2, 2K], r being a decimal in range of [0, 1).

8. The signal generator according to claim 1, wherein the control circuit generates, based on frequency change characteristics of the target signal, the control word information having the same change characteristics.

9. A signal generation method for use in a signal generator, the method comprising:

receiving input information and generating variable control word information based on the received input information, the input information including type information indicating a waveform type of frequency change of a target signal and parameter information of the target signal;

generating a base time unit; and generating the target signal having a variable frequency based on the variable control word information and the base time unit, the method further comprises:

extracting the type information and the parameter information from the input information, and calculating the variable control word information based on the type information and the parameter information; and outputting the calculated control word information to a signal generation circuit of the signal generator, wherein the output frequency of the signal generation circuit is approximately proportional to the control word information when a predetermined condition is satisfied, and the predetermined condition is that a change amount of the control word information is less than a predetermined threshold.

10. The signal generating method according to claim 9, wherein the control word information is set in form of F=I+r, I being an integer in range of [2, 2K], r being a decimal in range of [0, 1).

11. The signal generation method according to claim 9, further comprising:

generating, based on frequency change characteristics of the target signal, the control word information having the same change characteristics.

* * * * *